United States Patent [19]
Savicki

[11] Patent Number: 5,861,783
[45] Date of Patent: Jan. 19, 1999

[54] CROSSTALK REDUCTION IN PARASITICALLY COUPLED CIRCUITS WITH AN RC NETWORK CONNECTING CIRCUIT GROUNDS

[75] Inventor: Joseph Peter Savicki, Clinton, N.J.

[73] Assignee: Lucent Technologies Inc., Murray Hill, N.J.

[21] Appl. No.: 904,520

[22] Filed: Aug. 1, 1997

[51] Int. Cl.[6] ....................................... H03H 1/02

[52] U.S. Cl. ............................. 333/172; 333/12

[58] Field of Search ................ 333/172, 12, 100

[56] References Cited

U.S. PATENT DOCUMENTS

| | | | |
|---|---|---|---|
| 5,128,832 | 7/1992 | Lawrence | 439/65 X |
| 5,146,506 | 9/1992 | Sasaki | 333/172 X |
| 5,673,009 | 9/1997 | Klas et al. | 333/12 X |

*Primary Examiner*—Robert J. Pascal
*Assistant Examiner*—Justin P. Bettendorf
*Attorney, Agent, or Firm*—Claude R. Narcisse

[57] ABSTRACT

The amplification of crosstalk between two isolated circuits due to a resonant condition between the two circuits is reduced by coupling the electrical grounds associated with the circuits with a series Resistor-Capacitor network.

1 Claim, 2 Drawing Sheets

CROSSTALK REDUCTION IN PARASITICALLY COUPLED CIRCUITS WITH AN RC NETWORK CONNECTING CIRCUIT GROUNDS

Cross References

This application is related to a commonly assigned and concurrently filed application entitled "Reduction of Parasitic Through Hole Via Capacitance In Multilayer Printed Circuit Boards" filed on Aug. 1, 1997 with Ser. No. 08/904,526 and which is hereby incorporated by reference.

BACKGROUND OF THE INVENTION

Field of the Invention

This invention relates to crosstalk reduction in electrical circuits and in particular to crosstalk reduction in communication circuits.

Description of the Related Art

In many communication systems electrical communication signals are conveyed between various equipment used in such systems. Typically, the electrical signals can be interconnected and routed to various equipment located at a central office. The interconnection and rerouting of the electrical signals are implemented with interconnection modules, some of which are called Digital Distributing Frames (DDF).

In a central office location which may contain various communication equipment, a plurality of DDF modules are typically disposed in a housing. Typically, a DDF module comprises several connectors, such as BNC connectors mounted on a printed circuit board. Cables carrying the electrical signals can be connected to the mounted connectors of the various housed DDF modules and to the various equipment at the central location thus interconnecting and rerouting various electrical signals. As is typically used with printed circuit boards, conductors electrically connected to the mounted connectors are formed on the circuit board by well known etching or plating processes. The conductors are typically traced on the surface of the printed circuit board so as to electrically and physically isolate them from other conductors traced on the printed circuit board. Each of the conductors may be associated with a particular electrical circuit and mounted connector. The particular circuit may be represented by conductor traces on the printed circuit board that may or may not be connected to components (e.g., resistors, capacitors, diodes, transformers) mounted on the printed circuit board. Also, each particular electrical circuit has its own electrical ground which is substantially electrically and physically isolated from other electrical grounds and conductor traces on the printed circuit board. The electrical and physical isolation of the conductors help prevent crosstalk between conductors associated with different circuits. Crosstalk is defined as undesired electromagnetic coupling that occurs between proximately located conductors carrying electrical signals.

Current DDF modules support two isolated circuits each of which is electrically connected to a mounted connector. These modules may also have one or two other connectors for monitoring the isolated circuits. Conductor traces connected to the various mounted connectors associated with the isolated circuits may be in close proximity to each other. As a result crosstalk can occur between these traces. However, said crosstalk can be attenuated with electrical shielding structures (e.g., plated vias, ground planes) mounted on the printed circuit board. These structures tend to further isolate the traces, including electrical ground traces, associated with the isolated circuits thereby reducing crosstalk that may occur between these circuits. However, under some circumstances, a resonant condition occurs between isolated circuits which can greatly amplify any crosstalk between such circuits rendering the electrical shielding technique ineffective.

Typically an electrical circuit such as the isolated circuits have a natural frequency which is the frequency at which a circuit oscillates in response to an impulse signal. The isolated circuit may also have circuit loops which are electric paths comprising of various electrical devices including conductors and parasitic elements. A parasitic element is an unintended element that is created as a result of the geometry of an electrical circuit. Thus, a resonant condition occurs when a signal is applied to one or both of the isolated circuits such that the signal frequency matches the natural frequency of unintended circuit loops formed by the parasitic elements. Therefore, a resonant condition occurs at certain frequencies or group of frequencies.

Methods are currently available to reduce the effects of such resonant conditions, but such methods result in the degradation of the signals applied to the isolated circuits. For example, the introduction of loss (connecting a resistor in series with the applied signals) to the isolated circuit can reduce crosstalk but such a method will adversely effect the signal quality (e.g., amplitude, phase and frequency distortions).

Therefore, there exists a need to reduce crosstalk due to resonating isolated circuits which are traced on a printed circuit board.

SUMMARY OF THE INVENTION

The present invention provides for a resistor-capacitor network that couples the respective electrical grounds of two circuits that are resonating with each other and to which signals having a certain quality are applied thus reducing crosstalk due to the resonant condition between the circuits substantially without degrading the quality of the applied signals.

The resistor-capacitor network comprises a resistor connected to the first electrical ground and a capacitor connected to the resistor and to the second electrical ground. The capacitor allows a current to flow through the resistor during a resonant condition thereby reducing the crosstalk due to resonance between the circuits.

DETAILED DESCRIPTION

Figure 1:
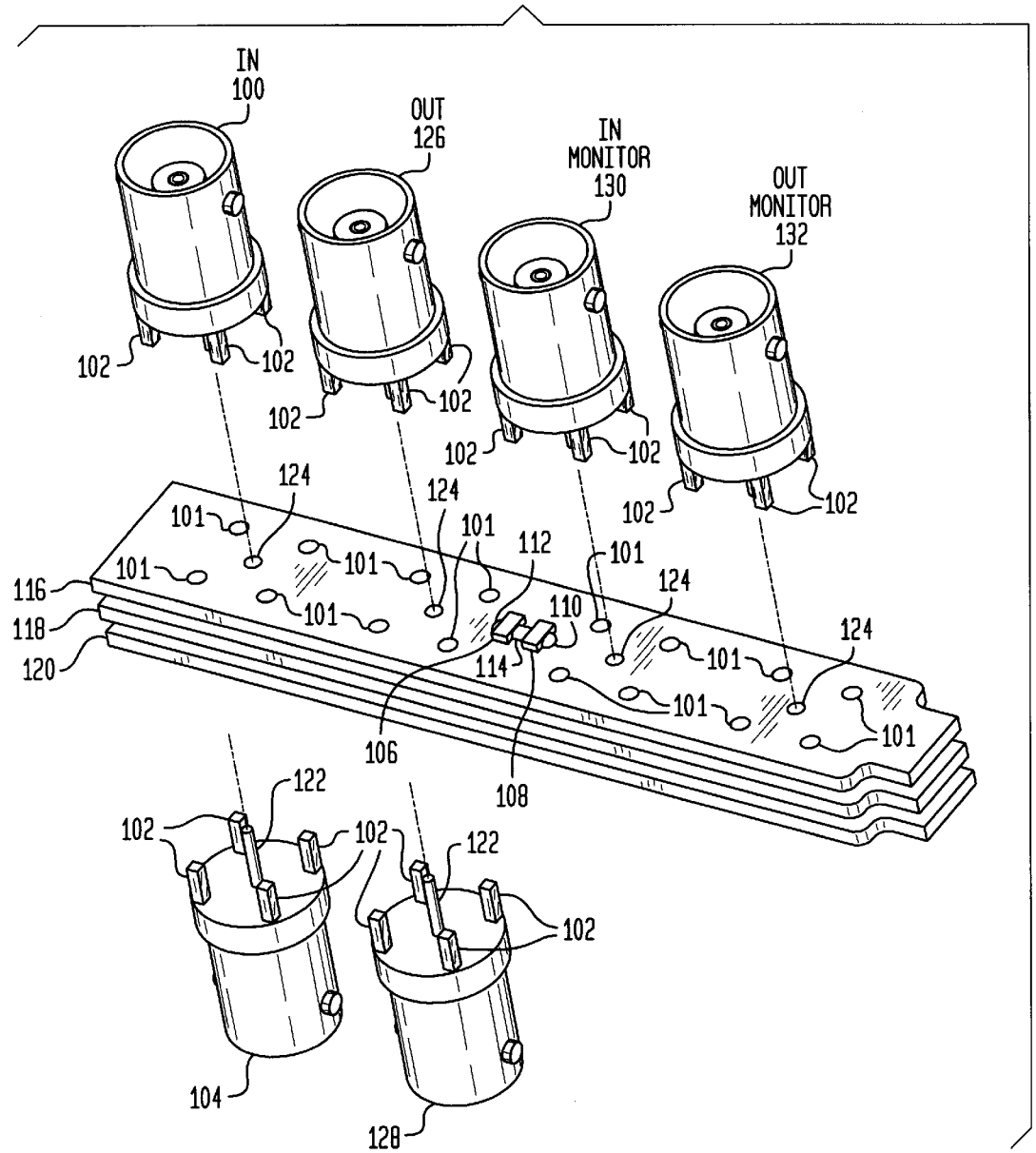
FIG. 1 depicts a perspective view of the present invention.

FIG. 1 depicts a perspective view of the present invention which is a DDF module comprising a printed circuit board with layer 116, 118 and 120. Although three layers are shown, the printed circuit board is not limited to any specific number of layers. The layers are typically made from an insulating material (e.g., FR-4, Epoxy Glass, Teflon) material which has a certain dielectric constant. A resistor 106 connected in series with a capacitor 108 serves to couple the electrical grounds 134, 136 (see FIG. 2) associated with a first and second circuit on the printed circuit board. Signals having a certain signal quality are applied to one or both of the isolated circuits. The signal quality is typically viewed as the state of the frequency components, amplitude and phase of a signal. For example, a signal of poor quality may have distorted frequency components, a distorted amplitude or phase. At frequencies where a resonant condition occurs, capacitor 108 allows current to flow through resistor 106. Resistor 106 by its very nature dissipates the energy of the flowing current. Thus, at resonant frequencies, current flows from one ground with which a first circuit is associated to another ground with which a second circuit is associated allowing resistor 106 to dissipate the energy of the flowing current thereby substantially eliminating the amplifying effect of the resonant condition on crosstalk substantially without degrading the quality of the applied signals. Typically, since the energy associated with the crosstalk at resonance is substantially smaller than the energy associated with the applied signals, the resistor has an insignificant effect on signal quality.

The connectors shown are BNC connectors but other similar connectors (e.g. SMA connectors) used for coupling electrical signals to a printed circuit board can be used. Connectors 100 and 104 are associated with a first circuit for a first signal type (e.g. input signals).

Connectors 100 and 104 are compliant pin type BNC connectors; connectors 100 and 104 have pins 102 which frictionally engage with holes 101 on top layer 116 (and on bottom layer 120; not shown) such that the connectors are fixedly attached to the printed circuit board. Central conductors 122 (not shown) of connectors 100 and 104 engage with plated through holes 124 on top layer 116 and bottom layer 120. Although not shown, it will be understood to one of ordinary skill in the art to which this invention belongs that the central conductors 122 of connectors 100 and 104 are electrically connected to each other via an etched conductor on one of the printed circuit board layers (116, 118 and 120). Any one of the printed circuit board layers (116, 118 and 120) can be used to electrically connect these central conductors. The particular layer used to electrically connect central conductors 122 of connectors 100 and 104 depends on specific design requirements of the DDF module.

A coaxial cable (not shown) carrying, for example, an input signal, is typically connected to connector 100. Another coaxial cable (not shown) having two ends has one end connected to connector 104 and the other end connected to another similarly configured DDF module or other communication equipment configured to receive such a connector. Thus, the first signal type associated with a first circuit can be routed or interconnected to other DDF modules or other equipment.

Although not shown, connectors 126, 130 and 132 have a central conductor 122. Connectors 126, 128, 130 and 132 are similarly compliant pin BNC connectors whose central conductors 122 are coupled to an electrical signal via coaxial cables (not shown). Connectors 126 and 128 are associated with a second circuit for a second signal type (e.g., output signals). Central conductors 122 of connectors 126 and 128 are electrically connected to each other via an etched or plated electrical network on one of the layers (116, 118 and 120). A coaxial cable carrying the second signal type is connected to connector 128. The second signal type can be routed and/or interconnected to other equipment or another DDF module via another coaxial cable connected to connector 126.

Connectors 130 and 132 are monitor connectors which are used to monitor the first and second signals respectively. In particular, central conductor 122 (not shown) of connector 130 engages a plated through hole 124 which is electrically connected, via an etched or plated electrical network on one of the printed circuit board layers (116, 118 and 120), to the plated through hole 124 for connector 100. Thus, when connector 130 is mounted on the printed circuit board, its central conductor 122 is electrically connected to the central conductor 122 of connector 100 through an electrical network. Consequently, a coaxial cable can be connected to connector 130 and to an equipment that can monitor the first signal. Connector 132 is similarly mounted to the printed circuit board such that its central conductor 122 is electrically coupled to the central conductor of connector 126. Thus, the second signal can be monitored with monitoring equipment connected to connector 132 via a coaxial cable. It should be noted that other cables (not only coaxial cables) can be used to couple electrical signals to the mounted connectors.

Figure 2:
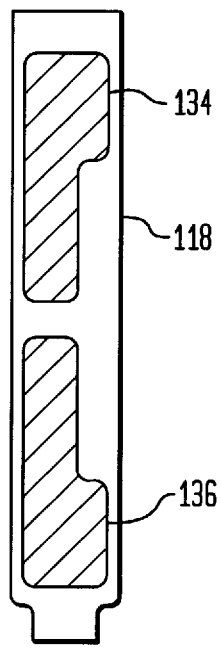
FIG. 2 depicts one layer of the multilayered printed circuit board of the present invention having two isolated ground planes.

Referring to FIG. 2, there is shown a top view of second layer 118. Electrical ground conductor 134 associated with the first circuit and electrical ground conductor 136 associated with the second circuit are shown. The electrical grounds (134, 136) are typically a metallic surface etched or plated onto layer 118 which has a particular dielectric constant. The shapes of the electrical grounds depicted are for illustrative purposes only. The particular geometry of the electrical grounds depends on the particular design requirements of the respective electrical circuits with which they are associated.

Figure 3:
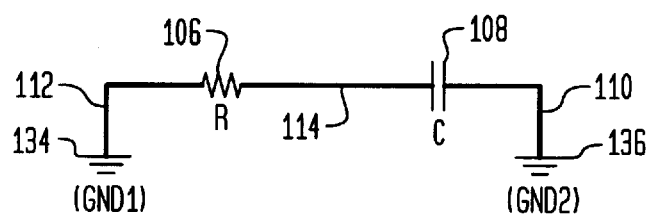
FIG. 3 shows an electrical schematic of the present invention.

Referring to FIG. 3, there is shown a schematic of the present invention in which a series Resistor-Capacitor network serves to electrically couple the two electrical grounds thereby reducing or substantially eliminating amplification of crosstalk due to a resonant condition between the two circuits with which the electrical grounds are associated. The series Resistor-Capacitor network comprises resistor 106 and capacitor 108 electrically connected to each other via conductor 114. Conductor 112 connects resistor 106 to electrical ground 134. Conductor 110 connects capacitor 108 to electrical ground 136. The particular value of resistor 106 and capacitor 108 can vary depending on the particular frequency at which the resonant condition occurs. Also, additional resistors and capacitors may be added to the series network to reduce or substantially eliminate the amplifying effect on crosstalk of a resonant condition between the two circuits.

Figure 4:
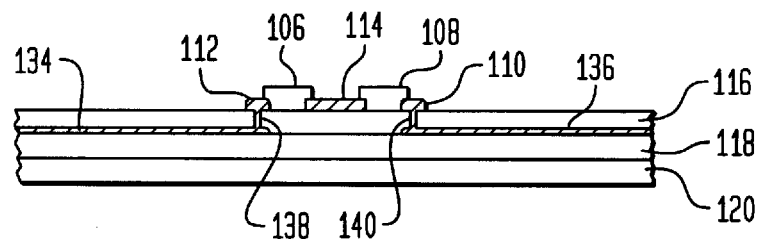
FIG. 4 shows a side view of the present invention.

FIG. 4 depicts a side view portion of the DDF showing how the two grounds are coupled with the series Resistor-Capacitor network. Electrical grounds 134 and 136 are etched or plated onto layer 118. Resistor 106 is a surface mount resistor which is electrically connected to conductor 112 and conductor 114. Conductor 112 is in turn electrically connected to electrical ground 134 via plated through hole 138. Capacitor 108 is also connected to conductor 114 and to conductor 110 which is in turn connected to electrical ground 136 via plated through hole 140. Although the series Resistor-Capacitor network is implemented with surface mountable components, it will be understood to those of ordinary skill in the art to which this invention belongs that other type of components (e.g., discrete, through hole, thin film, integrated circuits ) can be used. Even though the present invention discusses DDF modules with two different circuits, it will be understood that the present invention is applicable to DDF modules with more than two different circuits. It will be further understood that the present invention is not limited to electrical circuits on DDF modules but to any circuitry on any type of printed circuit board which experiences crosstalk amplification as a result of a resonant condition involving parasitic elements between at least two different circuits on a printed circuit board.

I claim:

1. A Resistor-Capacitor network for reducing crosstalk due to a resonant condition between a first circuit having a first electrical ground and a second circuit having a second electrical ground where signals of a certain quality are applied to the circuits, the Resistor-Capacitor network comprising:

a resistor connected to the first electrical ground;

a capacitor connected to the resistor and to the second electrical ground;

the capacitor allowing a current to flow through the resistor during a resonant condition thereby reducing the crosstalk due to resonance between the circuits substantially without degrading the quality of the applied signals.

* * * * *